United States Patent
Endo et al.

(10) Patent No.: US 6,452,851 B1
(45) Date of Patent: Sep. 17, 2002

(54) SEMICONDUCTOR INTEGRATED CIRCUIT DEVICE (75) Inventors: Hitoshi Endo, Akishima (JP); Katsuhiko Wakasugi, Kitakyusyu (JP); Youichi Sato, Iruma (JP); Kazuyoshi Sato, Higashimurayama (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/830,416
(22) PCT Filed: Oct. 29, 1998
(86) PCT No.: PCT/JP98/04902
§ 371 (c)(1), (2), (4) Date: Apr. 27, 2001
(87) PCT Pub. No.: WO00/26920
PCT Pub. Date: May 11, 2000
(51) Int. Cl.$^7$ ................................................. G11C 7/00
(52) U.S. Cl. ........................ 365/205; 365/154; 365/190; 365/207
(58) Field of Search ................................. 365/205, 207, 365/154, 190, 129, 189.01

(56) References Cited

U.S. PATENT DOCUMENTS 5,870,344 A  2/1999  Ozawa

FOREIGN PATENT DOCUMENTS

| JP | 1-192078 | 8/1989 |
|---|---|---|
| JP | 2-276094 | 11/1990 |
| JP | 2-294994 | 12/1990 |
| JP | 3-122897 | 5/1991 |
| JP | 6-267271 | 9/1994 |
| JP | 9-251782 | 9/1997 |

*Primary Examiner*—Hoai V. Ho
(74) *Attorney, Agent, or Firm*—Miles & Stockbridge P.C.

(57) ABSTRACT

A memory cell array configured using static memory cells is provided with pre-amplifiers each of which receives a signal of a memory cell, which is read into each complementary bit line pair, and a main amplifier which receives a signal outputted from each of the pre-amplifiers. The number of the plurality of memory cells connected to the complementary bit lines is restricted in such a manner that the amplitude of the signal read into each complementary bit line pair, which is supplied to the input of the pre-amplifier, becomes greater than that of a signal outputted from the pre-amplifier during a period of from the selection of a word line to the start of the operation of the main amplifier.

17 Claims, 9 Drawing Sheets

SEMICONDUCTOR INTEGRATED CIRCUIT DEVICE

TECHNICAL FIELD

The present invention relates to a semiconductor integrated circuit device, and particularly to a technology effective for application to one incorporating therein a memory circuit activated at high speed through the use of static memory cells.

BACKGROUND ART

Japanese Patent Application Laid-Open No. Hei 9(1997)-251782 is known as an example of a semiconductor memory device intended for the scale-down of a device or element and the speed-up of a data read rate. In the semiconductor memory device described in the present publication, a pre-sense amplifier having a CMOS latch configuration is provided for each bit line pair connected with input/output nodes of each static memory cell in order to achieve the scale-down of a memory cell array and speed up a data read rate while the bit lines are being kept in full amplitude upon a data read operation. The pre-sense amplifier is one for amplifying a small voltage read into the bit line pair from the corresponding memory cell according to a word line selecting operation, bringing the bit line pair to full amplitude and supplying such a full-amplitude signal to a main amplifier.

Figure 10:
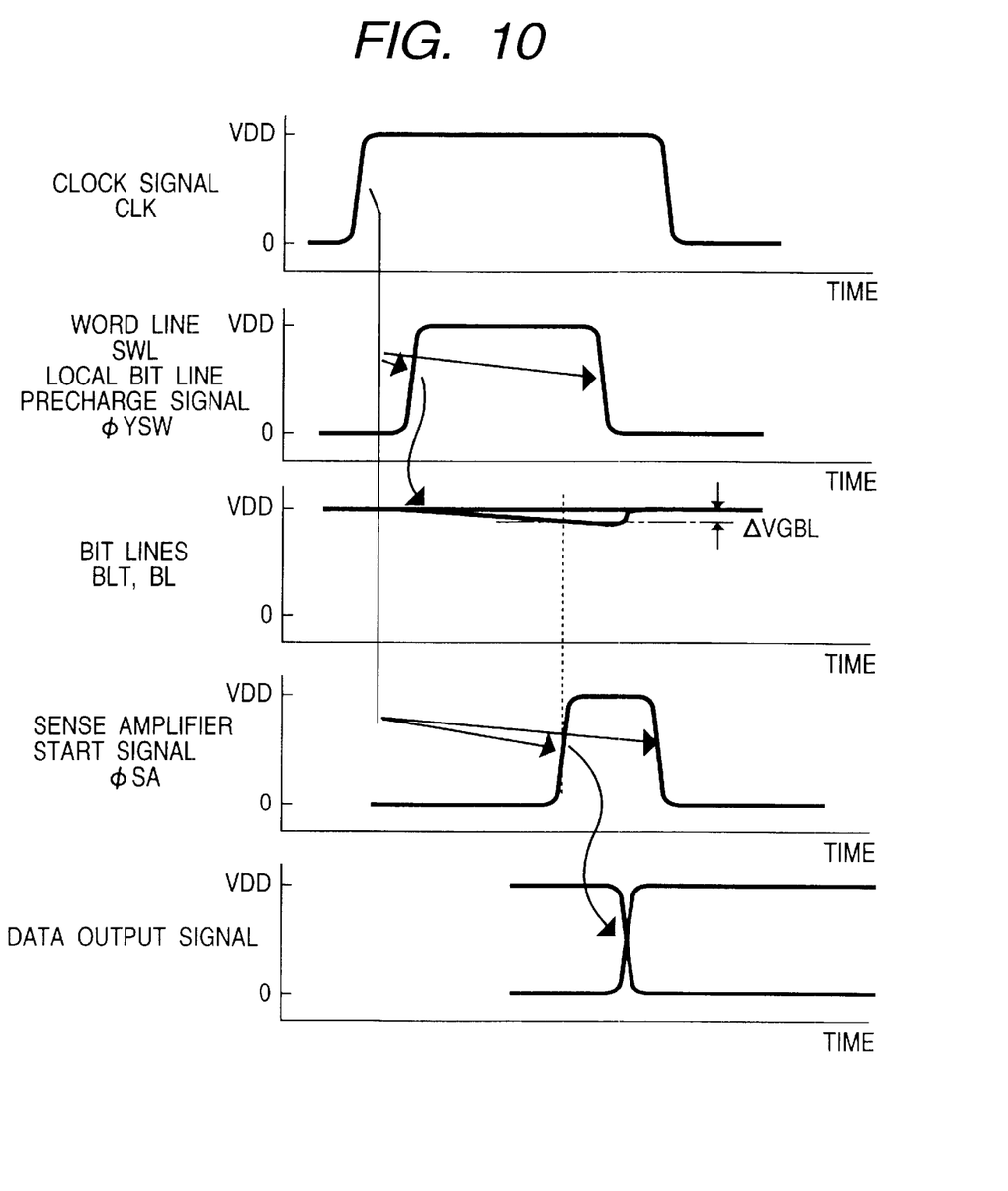
FIG. 10 is a waveform diagram for describing a read operation of a conventional static RAM.

Namely, in the conventional static RAM as pointed out even in the above publication, the memory cell array is increasingly scaled down to achieve a great increase in storage capacity, and each individual memory cells are reduced in load drive capability with the scale-down thereof. Further, the parasitic capacitance and parasitic resistance of the complementary bit lines also increase. Thus, it is necessary to spend a long period of time up to the acquisition of a signal amount necessary to take such a configuration as to drive a large load with a memory cell low in load drive capability to thereby obtain a read signal on complementary bit lines. When a word line is selected in response to the rising edge of a clock signal CLK, one memory cell is connected to complementary bit lines BLT and BLB, and one of the complementary bit lines BLT and BLB is discharged from a precharge potential VDD through on-state drive MOSFETs of the memory cell as in the case of a waveform diagram shown in FIG. 10 by way of example, a long period of time would be spent until the potential of each bit line having a large parasitic capacitance and a large parasitic resistance is discharged with small current drive capability and a signal amount ΔVGBL necessary for an amplifying operation of a sense amplifier is obtained.

Thus, in the invention described in the above publication, the pre-sense amplifier having the CMOS latch configuration is provided for the bit line pair connected with the input/output nodes of the static memory cell to increase the small voltage read into the bit line pair from the memory cell and bring the bit line pair to full amplitude, followed by transfer of such a full amplitude signal to its corresponding main sense amplifier.

Even in the case of this configuration, however, a signal amount on the bit lines, necessary for the amplifying operation of the pre-sense amplifier must be formed by the memory cell per se. Namely, it is necessary to delay the amplifying operation until a small signal necessary for the amplifying operation of the pre-sense amplifier is obtained at the bit lines since the selection of the corresponding word line in a manner similar to the waveform diagram of FIG. 10. When a CMOS latch circuit malfunctions due to the commencement of its amplifying operation in an insufficient state of an input signal amount particularly when the CMOS latch circuit is used as the pre-sense amplifier, such destruction of stored data that it inverts a stored state of a memory cell, is developed, whereby reliability cannot be kept as a memory. Therefore, the use of the CMOS latch circuit needs to extra ensure an operation timing margin as compared with the use of a differential amplifier circuit whose normal input and output are electrically isolated from each other, thus leading to the need for a further delay in operation start timing correspondingly.

As described above, the pre-sense amplifier provided to charge/discharge the bit line pair having the relatively large parasitic capacitance at high speed needs to provide MOSFETs large in size as compared with MOSFETs constituting each memory cell. Further, the CMOS latch circuit whose input and output are cross-connected, is used. Therefore, the parasitic capacitance increases to an in-negligible extent. Thus, a problem arises in that since the parasitic capacitance added to the bit line pair further increases due to the pre-sense amplifier itself which should essentially have been provided for the speed-up, the time required to obtain a desired signal amount read into the bit line pair from the memory cell loses as compared with the non-provision of the pre-sense amplifier.

Besides, the size of each memory cell decreases with the scale-down of each element, and correspondingly the pitch of the bit line pair is also formed in a high density. It is-necessary to adopt such a contrivance as to incorporate MOSFETs large in size as compared with the MOSFETs constituting each memory cell into the pitch of the bit line pair formed in such a high density for the purpose of charging/discharging the bit line pair at high speed. Further, another problem is also involved in that in the pre-sense amplifier using such a CMOS latch circuit as described above, the bit lines must be precharged to one-half the source voltage in a manner similar to a dynamic RAM and hence a power circuit for stably forming a precharge voltage set to one-half the source voltage is needed, and DC currents simultaneously flow between P channel MOSFETs and N channel MOSFETs of a large number of pre-sense amplifiers upon the commencement of amplification of the pre-sense amplifiers, thereby increasing current consumption and noise developed in power or source line.

Accordingly, the present invention aims to provide a semiconductor integrated circuit device equipped with at least one semiconductor memory circuit, which makes use of static memory cells and has achieved the speed-up with a simple configuration. The above, other objects and novel features of the present invention will become apparent from the description of the present specification and the accompanying drawings.

DISCLOSURE OF THE INVENTION

A summary of a typical one of the inventions disclosed in the present application will be described in brief as follows: A memory cell array configured using static memory cells is provided with pre-amplifiers each of which receives a signal of one memory cell, which is read into each of complementary bit line pairs, and a main amplifier which receives a signal outputted from the pre-amplifier. The number of the plurality of memory cells connected to the complementary bit lines is restricted in such a manner that the amplitude of the signal read into the complementary bit line pair, which is supplied to the input of the pre-amplifier, becomes greater than that of a signal outputted from the pre-amplifier during a period of from the selection of each word line to the start of the operation of the main amplifier.

BEST MODE FOR CARRYING OUT THE INVENTION

The present invention will be explained in accordance with the accompanying drawings to describe it in more details.

Figure 1:
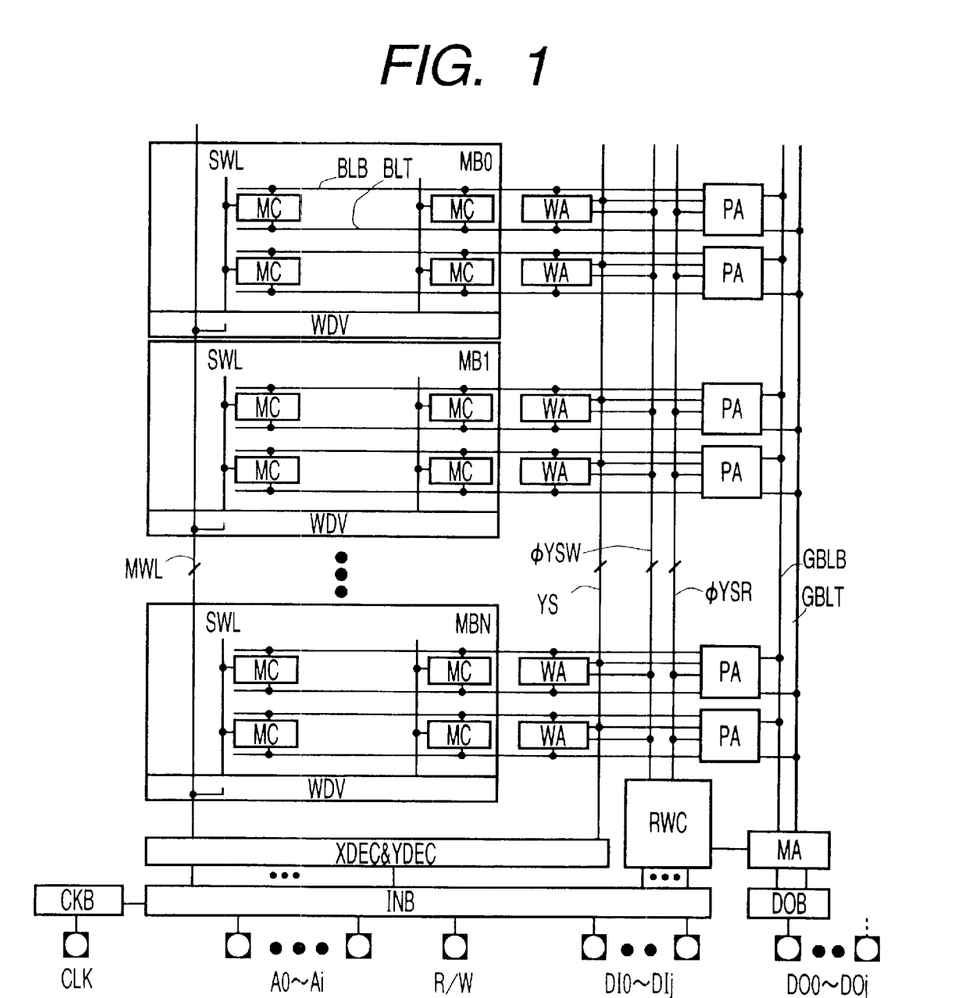
FIG. 1 is a schematic block diagram showing one embodiment of a semiconductor memory circuit according to the present invention.

A block diagram of one embodiment of a semiconductor memory circuit according to the present invention is shown in FIG. 1. Although not restricted in particular, the semiconductor memory circuit shown in the same drawing is used as a RAM (Random Access Memory) macro cell built in a digital integrated circuit device which comprises such a CMOS gate array or the like to be described later.

A memory cell array is divided into a plurality of memory blocks MB0 through MBN. In the same drawing, a memory cell array corresponding to one bit is illustratively shown as a typical one. When the reading/wiring of data in units of plural bits is performed, a plurality of memory cells arrays similar to above are provided in the direction in which word lines (MWL, SWL) shown in the same drawing extend. Complementary global bit lines GBLT and GBLB are respectively provided in plural pairs in association with such a plurality of memory cell arrays.

Input circuits INB and CKB, decoders XDEC and YDEC and a control circuit RWC are commonly provided in association with one or plural memory cell arrays referred to above. A main amplifier MA and an output buffer DOB are provided in plural form (0 through j) in association with the number of the pairs of the complementary global bit lines GBLT and GBLB provided in association with the data given in the units of the plural bits.

A memory block MB0 comprises a plurality of static memory cells MC respectively provided at points where a plurality of sub-word lines SWL and a plurality of complementary bit lines BLT and BLB intersect. The complementary bit lines BLT and BLB to which the memory cells MC are connected as described above, will be called "local bit lines" to be put in contrast with the global bit lines GBLT and GBLB.

Output terminals of write amplifiers WA and input terminals of pre-amplifiers PA are connected to their corresponding complementary local bit lines BLB and BLT. Although not restricted in particular, each pre-amplifier PA referred to above has a tristate output function. Complementary output terminals thereof are connected to their corresponding global bit lines GBLT and GBLB. Namely, a plurality of the pre-amplifiers PA provided in one memory cell array associated with one-bit read/write are interconnected with one another in the form of wired OR logic by the complementary global bit lines GBLT and GBLB.

As to the sub-word lines SWL in a plurality of memory blocks of the memory cell array, only the corresponding sub-word line SWL associated with one memory block is brought to a selected state by a main word line MWL extended so as to skewer memory cell arrays similar to the above memory cell array provided in association with the plurality of memory blocks MB0 through MBN and the data given in the plural bit units, and one of word drivers WDV, which receives a block select signal.

One of the plurality of pre-amplifiers PA or write amplifiers WA corresponding to the plurality of complementary local bit lines BLT and BLB provided in the selected memory block is selected based on a block select signal, a column select signal YS, a read control signal $\phi$YSR and a write control signal $\phi$YSW. Upon a write operation, for example, one write amplifier WA is brought to an operating state to thereby transmit a write signal corresponding to write data to its corresponding complementary local bit lines BLT and BLB. Upon a read operation, one pre-amplifier is brought to an operating state to thereby transmit a read signal from the corresponding memory cell to its corresponding main amplifier MA through the complementary global bit lines GBLT and GBLB, followed by output thereof through the output buffer DOB.

The input circuit INB receives address signals A0 through Ai comprised of plural bits and transfers X address signals used for word-line selecting operations to the X decoder circuit XDEC of the decoders circuits XDEC & YDEC, and transmits Y address signals used for local bit-line selecting operations to the Y decoder circuit YDEC thereof. Further, the input circuit INB receives a read/write control signal R/W and write data DI0 through DIj comprised of plural bits therein and transfers their corresponding signals to the control circuit RWC. The clock buffer CKB receives a clock signal CLK therein and supplies a clock signal to the input circuit INB or the like.

Figure 2:
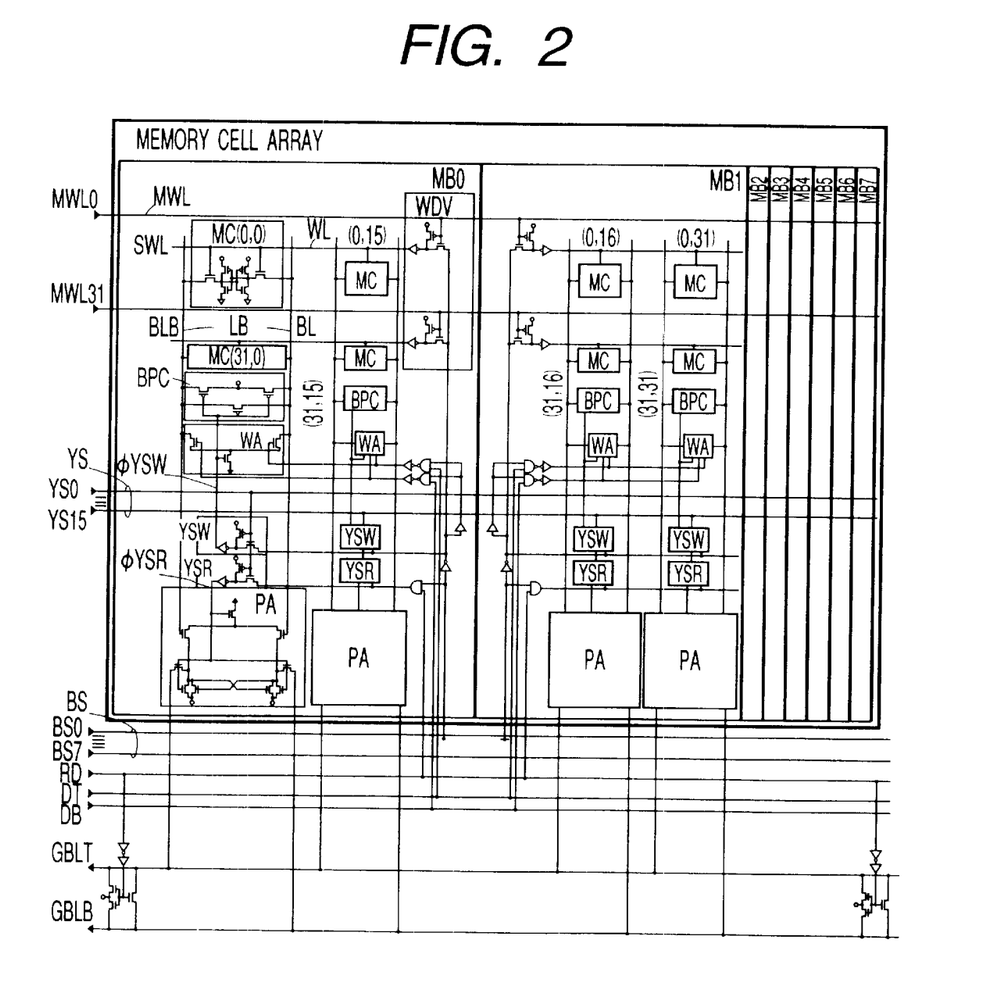
FIG. 2 is a schematic circuit diagram illustrating one embodiment of a semiconductor memory circuit according to the present invention.

A schematic circuit diagram of one embodiment of a semiconductor memory circuit according to the present invention is shown in FIG. 2. A memory cell array comprises eight memory blocks MB0 through MB7. A circuit diagram of one memory block MB0 thereof and a block diagram of a memory block MB1 are illustratively shown in the same drawing as typical ones, whereas other memory blocks MB2 through MB7 are shown as black boxes. A circuit diagram of the one memory block MB0 is shown in FIG. 3.

Figure 3:
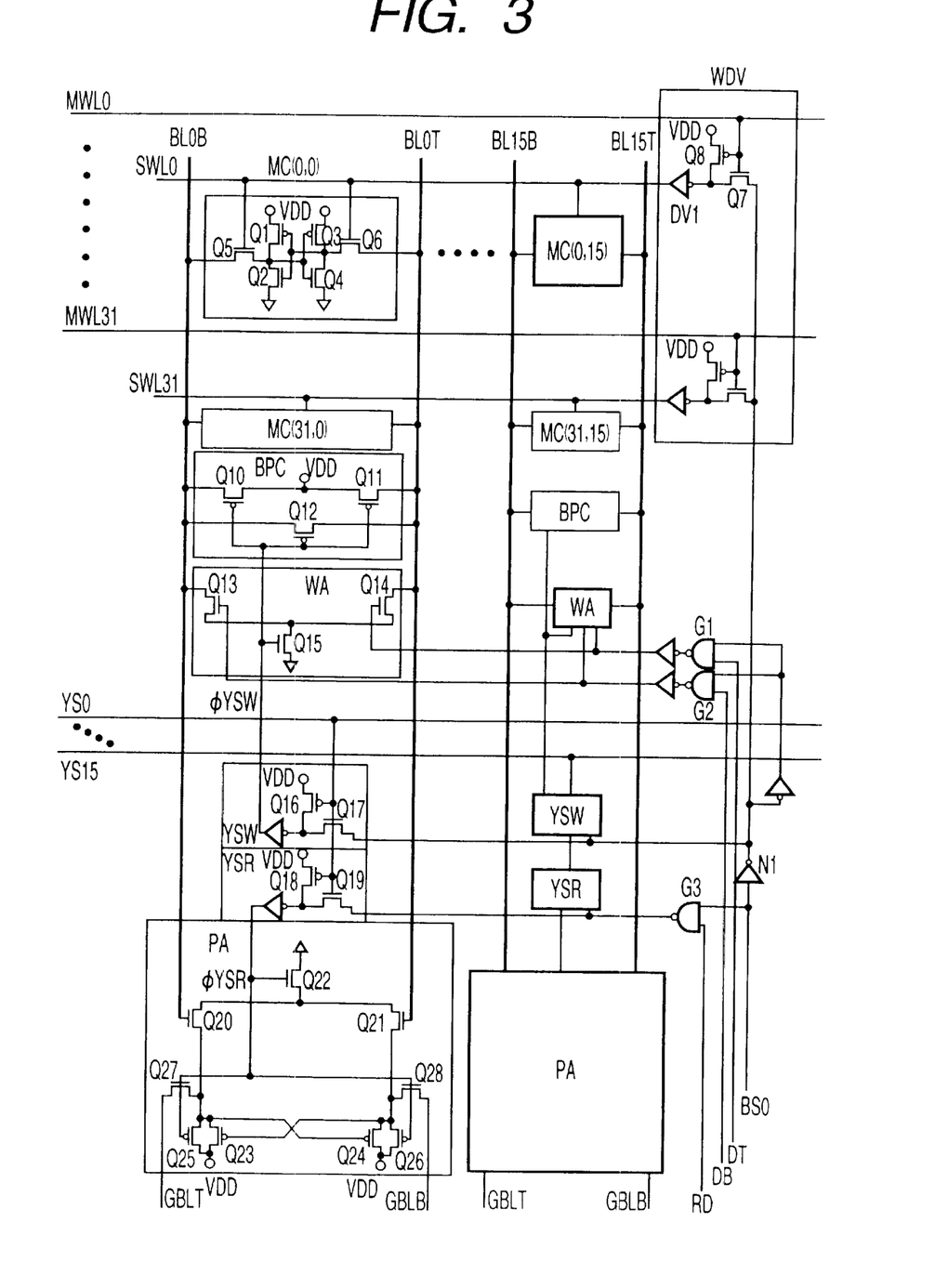
FIG. 3 is a circuit diagram of one memory block constituting a memory cell array employed in the semiconductor memory circuit shown in FIG. 2.

In FIG. 3, one memory block is configured as follows: Sixteen memory cells are connected to one sub-word line SWL as in the case of memory cells MC (0, 0) through MC (0, 15), a pair of complementary local bit lines LB comprises BL0B and BL0T, and thirty-two memory cells are connected to the pair of complementary local bit lines LB as in the case of MC(0, 0) through MC (31, 0). Thus, the memory cells equivalent to 16×32=512 in number are laid out in one memory block MB0. Since one memory cell array comprises eight memory blocks in FIG. 2, the one memory cell array is set to have 512×8=4096 (bits) storage capacities in total.

As a specific circuit of the memory cell MC (0, 0) is shown as a typical one in FIG. 3, the memory cell MC (0, 0) comprises a latch circuit wherein inputs and outputs of two CMOS inverter circuits respectively comprising P channel MOSFETs Q1 and Q3 and N channel MOSFETs Q2 and Q4 are cross-connected to one another, and N channel transfer gates MOSFETs Q5 and Q6 provided between a pair of input/output nodes of the latch circuit and the complementary local bit lines BL0B and BL0T. The gates of the MOSFETs Q5 and Q6 are connected to their corresponding sub-word line SWL.

Each sub-word line SWL is driven by its corresponding word driver WDV. The word driver WDV comprises a driver DV1 comprising a CMOS inverter circuit or the like, a pull-up P channel MOSFET Q8 provided between an input terminal of the driver DV1 and a source voltage VDD and whose gate is electrically connected to its corresponding main word line MWL0, and an N channel switch MOSFET Q7 whose gate is electrically connected to its corresponding main word line MWL and supplied with an inverted signal of a block select signal BS0. An inverter circuit N1 for forming the inverted block select signal BS1 transferred to the MOSFET Q7 is provided in the control circuit RWC. The block select signal BS0 is formed by a Y-system decoder circuit YDEC.

When, for example, the main word line MWL0 is brought to a select level corresponding to a high level, and the block select signal BS0 is brought to a select level corresponding to a high level, the output signal of the inverter circuit N1 is rendered low in level. Owing to the high level of the main word line MWL0, the P channel MOSFET Q8 is brought to an off state and the N channel MOSFET Q7 is brought to an on state. Thus, since the low-level signal of the inverter circuit N1 is transferred to the sub-word driver DV1 through the MOSFET Q7, the sub-word line SWL0 is brought to a select level equivalent to a high level corresponding to the source voltage VDD.

At this time, a non-selected main word line MWL31 is brought to a non-select level corresponding to a low level. Thus, an N channel MOSFET for transferring the block select signal BS0 is brought to an off state, and a P channel pull-up MOSFET is brought to an on state to supply the high level like the source voltage VDD to its corresponding input terminal of the sub-word driver, so that a sub-word driver SWL31 or the like is brought to a non-select level corresponding to a low level. While an N channel MOSFET corresponding to the main word line MWL0 is brought to an on state in other memory blocks, block select signals BS1 through BS7 respectively assume a non-select low level. Thus, since the high level is transferred to input terminals of sub-word drivers through inverter circuits similar to the above, the sub-word line SWL0 corresponding to the main word line MWL0 for other memory blocks MB1 through MB7 is brought to a non-select level corresponding to a low level. Accordingly, only one sub-word line SWL in one memory block specified by each of the block select signals BS0 through BS7, of the plurality of memory blocks in one memory array is held in a selected state.

A bit line precharge circuit BPC is connected to the complementary local bit lines BL0B and BL0T. The bit line precharge circuit BPC comprises P channel MOSFETs Q10 and Q11 for precharging the complementary local bit lines BL0B and BL0T to the source voltage VDD, and a P channel MOSFET Q12 for short-circuiting the complementary local bit lines BL0B and BL0T. The gates of these MOSFETs Q10 through Q12 are respectively supplied with a local bit-line precharge signal φYSW.

Output terminals of a write amplifier WA are respectively connected to the complementary local bit lines BL0B and BL0T. The write amplifier WA comprises driving N channel MOSFETs Q13 and Q14 brought to differential form, and a switch MOSFET Q15 for write amplifier activation, which is provided between the shared sources of the driving MOSFETs Q13 and Q14 and a circuit's ground potential. The drains of the driving MOSFETs Q13 and Q14 respectively serve as the output terminals of the write amplifier WA and are connected to their corresponding local bit lines BL0B and BL0T. The gates of the driving MOSFETs Q13 and Q14 respectively serve as input terminals of the write amplifier WA and are respectively supplied with complementary write data. As the write data supplied to the input terminals of the write amplifier WA, write data formed by gate circuits G1 and G2, which receive a block select signal corresponding to the block select signal BS0, and write data DT and DB therein, are respectively formed through driving inverter circuits. The gate of the switch MOSFET Q15 for write amplifier activation is supplied with the local bit-line precharge signal φYSW.

As to each of the write amplifiers WA employed in the present embodiment, when the local bit-line precharge signal φYSW is rendered high in level and the precharge operation is completed, the write amplifier WA is activated regardless of read/write operations. Since, however, the write data DT and DB respectively remain at a low level upon the read operation, the driving MOSFETs Q13 and Q14 are both brought to an off state so that the write operation is not carried out.

Input terminals of each pre-amplifier PA are connected to their corresponding complementary local bit lines BL0B and BL0T. The pre-amplifier PA comprises N channel MOSFETs Q20 and Q21 set to differential form, a switch MOSFET Q22 for pre-amplifier activation, which is provided between the shared sources of the differential MOSFETs Q20 and Q21 and the circuit's ground potential, a load circuit provided between the drains of the differential MOSFETs Q20 and Q21 and the source voltages VDD, and N channel output MOSFETs Q27 and Q28 provided between the drains of the differential MOSFETs Q20 and Q21 and global bit lines GBLT and GBLB. The gates of the differential MOSFETs Q20 and Q21 respectively serve as input terminals of the pre-amplifier and are connected to their corresponding local bit lines BL0B and BL0T.

Although not restricted in particular, the load circuit comprises P channel MOSFETs Q23 and Q24 whose gates and sources are respectively cross-connected. Further, P channel precharge MOSFETs Q25 and Q26 are respectively provided in parallel with the load MOSFETs Q23 and Q24. The gates of the switch MOSFET Q22 for pre-amplifier activation, output MOSFETs Q27 and Q28, and precharge MOSFETs Q25 and Q26 are respectively supplied with a pre-amplifier start signal φYSR.

The local bit-line precharge signal φYSW and pre-amplifier start signal φYSR are respectively formed or produced by signal generating circuits YSW and YSR. The signal generating circuit YSW comprises a pull-up P channel MOSFET Q16 similar to the sub-word driver, an N channel MOSFET Q17 for transferring a select signal, and a driving inverter circuit. The signal generating circuit YSW is supplied with the output signal of the inverter circuit N1 which receives the block select signal BS0, and a column select signal YS0. Thus, in the selected memory block, the signal generating circuit YSW corresponding to the specified local bit lines brings the local bit-line precharge signal φYSW to a high level to thereby complete the bit line precharge operation, thus allowing read/write. In each non-selected memory block and the selected memory block, the signal generating circuit YSW for bringing the column select signal to a non-select level holds the pull-up MOSFET Q16 in an on state and brings the input signal of the inverter circuit to a high level. Therefore, the signal generating circuit YSW produces or forms a low-level output signal to thereby hold the bit line precharge circuit BPC in an operating state.

The signal generating circuit YSR also comprises a pull-up P channel MOSFET Q18 similar to the sub-word driver, an N channel MOSFET Q19 for transferring a select signal and a driving inverter circuit. The signal generating circuit YSR is supplied with a signal outputted from a gate circuit G3 which receives the block select signal BS0 and a read control signal RD therein, and the column select signal YS0. Thus, in the selected memory block and the signal generating circuit YSR corresponding to local bit lines on which the column select signal YS0 is rendered high in level upon the read operation in which the read control signal RD is rendered high in level, the high-level pre-amplifier start signal φYSR is raised to a high level. Even in the case of each non-selected memory block and the selected memory block, the signal generating circuit YSR for bringing the column select signal to a non-selected state holds the pull-up MOSFET Q16 in an on state to thereby bring the input signal of the inverter circuit to a high level. Therefore, the signal generating circuit YSR forms a low-level output signal to bring the pre-amplifier PA to a non-operating state. The selected pre-amplifier PA outputs an amplified signal to the global bit lines GBLT and GBLB through the output MOSFETs Q27 and Q28.

In one memory cell array in FIG. 2, one memory block specified by a block select signal BS is selected from the eight memory blocks MB0 through MB7. Only a write amplifier WA or pre-amplifier PA corresponding to one pair of complementary local bit lines designated by a column select signal YS, of sixteen pairs of complementary local bit lines LB in such a selected memory block, is activated according to write/read operation modes.

Since sixteen pre-amplifiers per memory block are connected to the global bit lines GBLT and GBLB, and eight memory blocks are provided for one memory array, one hundred and twenty-eight pre-amplifiers are connected to the global bit lines GBLT and GBLB in total. The amplified signal of the selected pre-amplifier PA of these is read into the global bit lines GBLT and GBLB through the output MOSFETs. Although not restricted in particular, the plurality of memory blocks constituting each memory cell array are configured so as to be arranged in the direction in which the word lines extend. Therefore, the global bit lines GBLB and GBLT are set so as to become relatively long in length, and the large number of pre-amplifiers PA are connected in the above-described manner, thus relatively increasing their parasitic capacitances and resistances. Therefore, each precharge circuit provided for the global bit lines GBLB and GBLT is placed at both ends of the global bit lines GBLB and GBLT. Since the global bit lines GBLB and GBLT serve as read-only output signal lines, the operation of the precharge circuit is controlled based on a read control signal RD. Namely, P channel MOSFETs constituting each precharge circuit are brought to an off state upon the read operation in which the read control signal RD is rendered high in level, so that the transfer of a read signal from the corresponding pre-amplifier PA is allowed.

Although not restricted in particular, word drivers MDV are formed at adjoining portions of adjacent two memory blocks MB0 and MB1. Namely, the corresponding word drivers WDV are respectively symmetrically placed in the adjoining portions of the two memory blocks MB0 and MB1 in mirror-inverted form. Owing to the above configuration, the sharing or the like of wiring for various signals supplied to the word drivers WDV can be rationalized.

Figure 4:
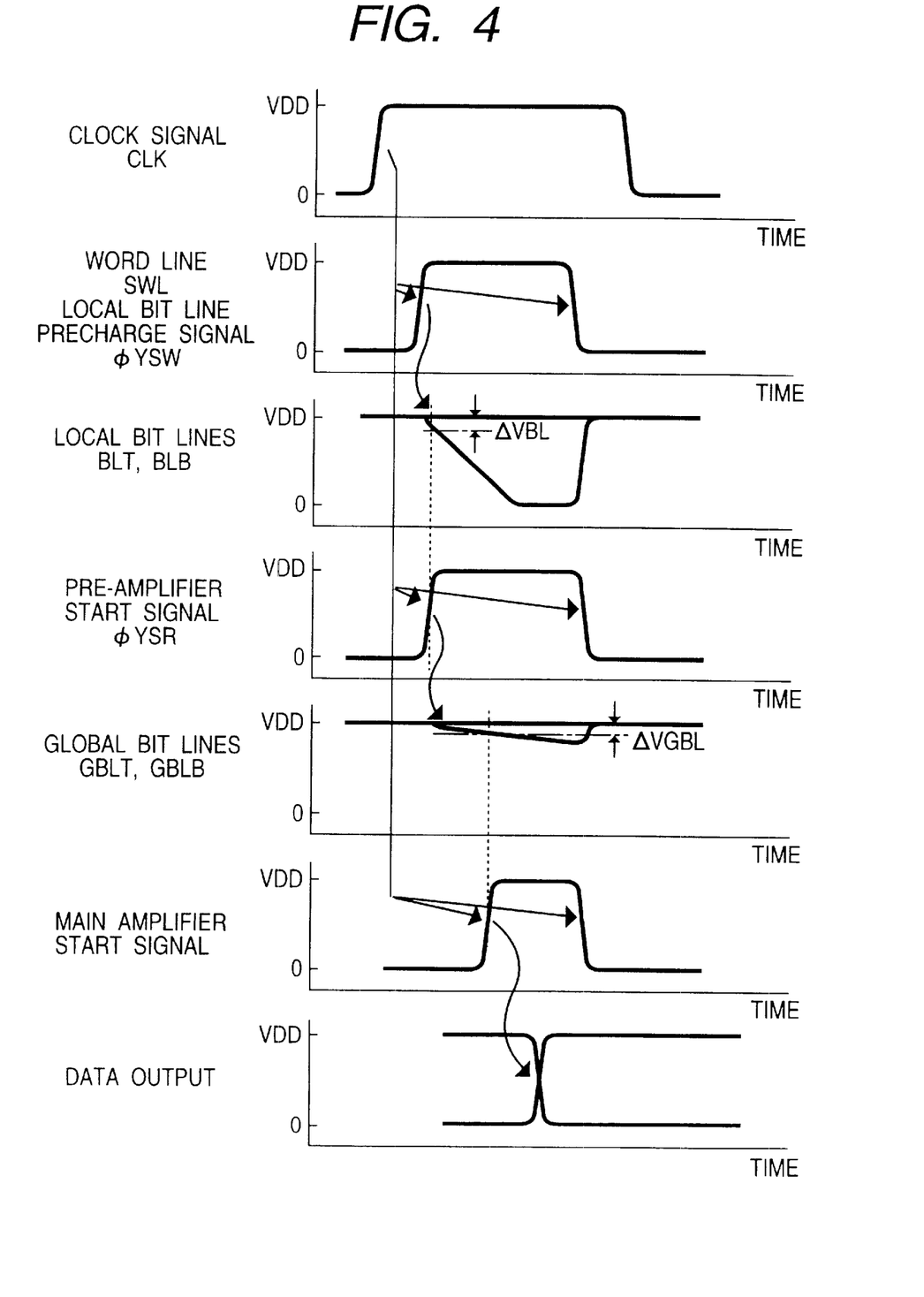
FIG. 4 is a waveform diagram for describing a read operation of a semiconductor memory circuit according to the present invention.

A waveform diagram for describing a read operation of a semiconductor memory circuit according to the present invention is shown in FIG. 4.

Address and control signals are inputted in synchronism with a clock signal CLK. One word line (sub-word line) SWL in one memory block and a local bit-line precharge signal φYSW are respectively brought to a high level according to the operations of the decoder circuits and the word driver WDV. Owing to the high level of the local bit-line precharge signal φYSW, a bit line precharge circuit BPC is brought to a non-operating state and its corresponding local bit lines BLT and BLB are respectively brought to a floating state. Therefore, either the bit line BLB or BLT is discharged through a memory cell connected to the local bit lines BLB and BLT based on the high level of the sub-word line SWL. Namely, since the N channel drive MOSFET Q2 or Q4 of the memory cell is held in an on state in association with its stored information, the local bit line BLB or BLT is discharged through the transfer gates MOSFETs Q5 and Q6 brought to the on state by the selecting operation of the word line SWL.

Since only the memory cells corresponding to the restricted number as in the case of thirty-two memory cells as described above are connected to the local bit lines BLT and BLB in the present embodiment, their wiring lengths are short and the number of transfer gate MOSFETs connected in association with the number of memory cells is also reduced like 32 to thereby reducing the parasitic capacitance and parasitic resistance. As a result, even if the memory cell comprises the scaled-down MOSFETs Q1 through Q6, the above discharge operation can be reduced to within a short period of time. As a result, the time required to obtain a signal amount (corresponding to the difference in potential between the complementary bit lines) ΔVBL necessary for the amplifying operation of each pre-amplifier PA can greatly be shortened.

As described above, the start timing signal φYSR for the pre-amplifier PA can be made fast or advanced up to the time immediately after the selection of the word line SWL in association with the signal voltage ΔVBL. In the present embodiment, a differential amplifier circuit whose input and output are electrically isolated from each other, is used as the pre-amplifier PA. Therefore, the timing provided to start the operation of the pre-amplifier PA can be reduced in time margin as compared with the case in which a CMOS latch circuit is used. Namely, even if the pre-amplifier PA is activated in an insufficient state of the signal amount ΔVBL, the output signal can be corrected according to an increase in signal amount ΔVBL. Since the shortage of the signal amount ΔVBL is immediately corrected particularly when a signal change in bit line per time is made abruptly as in the present embodiment, such a problem that the determination of an output signal would be delayed due to the inversion of the output signal in mid course, does not arise. On the other hand, since such a correction as described above cannot be made due to a position feedback operation of the CMOS latch circuit when the CMOS latch circuit is used, it is necessary to set a sufficient time margin to the operation start timing in consideration of a worst case.

An amplified signal is transferred to the corresponding global bit lines GBLT and GBLB according to the amplifying operation of the pre-amplifier PA. In the present embodiment, the pre-amplifiers corresponding even to 128 are connected to the global bit lines GBLT and GBLB to lengthen their wiring lengths and increase their parasitic capacitances and resistances.

Thus, the global bit lines GBLT and GBLB are caused to increase in parasitic capacitance and resistance, and the pre-amplifier PA is set so as to be relatively low in drive capability, thereby restricting the amplitude of the signal on the global bit lines GBLT and GBLB as small as possible. Namely, the amplitude of the signal on the global bit lines GBLT and GBLB is set to a limited level required to obtain a signal amount $\Delta$VGBL necessary for the amplifying operation of the main amplifier MA. Such a reduction in signal amplitude allows an increase in wiring length and the speed-up of the transfer of a signal to signal transfer or communication channels or paths made high in parasitic capacitance and resistance.

The reduction in the drive capability of the pre-amplifier PA is convenient even to the layout of a semiconductor memory circuit. Namely, the pitch of each local bit line is narrowly formed in association with each scaled-down memory cell. Since the pre-amplifiers PA must be laid out within such narrow pitches in a one-to-one correspondence with one another, MOSFETs constituting each pre-amplifier PA cannot be formed in large sizes. Therefore, the pre-amplifiers PA are respectively formed in necessary minimum MOSFET sizes in association with the parasitic capacitance and resistance for the global bit lines GBLT and GBLB. In other words, the number of memory blocks formed in one memory array, i.e., the lengths of the global bit lines GBLT and GBLB, or the like are selected so that they have parasitic capacitances and resistances corresponding to the drive capability of each MOSFET capable of being formed in accordance with the pitch of each local bit line referred to above.

A write amplifier WA and a bit line precharge circuit BPC are also formed in accordance with the pitch of each local bit line. Since the local bit lines have only small parasitic capacitances and parasitic resistances so as to be capable of driving at high speed within each scaled-down memory cell as described above, the sizes of MOSFETs constituting the write amplifier WA and the bit line precharge circuit BPC may be small, thus causing no particular problem.

The present embodiment is characterized in that a signal read from each memory cell is not subjected to an amplifying operation judging from a signal level despite that a multistage amplifier circuit like a pre-amplifier and a main amplifier is used as a hierarchical structure as in the case of the local bit lines and global bit lines. Namely, while the pre-amplifier PA has been described as the amplifier circuit, it does not perform the amplifying operation insofar as the signal level is concerned. This is because the amplitude of a signal on the local bit lines BLT and BLB substantially takes the form of full amplitude corresponding to the source voltage VDD, whereas the amplitude of a signal on the global bit lines GBLT and GBLB, which corresponds to the output signal of the pre-amplifier PA for amplifying the above signal, is set as a restricted small signal amplitude. The amplifying operation of the pre-amplifier PA employed in the present embodiment is characterized by current amplification other than the amplifying operation executed as for signal amplitude. Namely, it can be assumed that the pre-amplifier PA performs a current amplifying operation so as to compensate for current drive capability of each memory cell to drive large parasitic capacitance and parasitic resistance and thereby form a signal amount $\Delta$VGBL necessary for the operation of the main amplifier MA at high speed, thereby achieving the speed-up of its operation. Alternatively, it can also be assumed that the load on each memory cell is lightened, the memory cell is regarded as a source for generating a voltage signal, and each pre-amplifier performs an amplifying operation while carrying out a voltage-current converting operation for converting such a voltage signal to a current signal.

In order to perform the above read operation, the amplitude of the signal read out into the local bit lines needs not to take the full amplitude corresponding to the source voltage VDD. Namely, the reason why the signal amplitude (change in signal) read into the local bit lines as described above is brought up to the potential corresponding to the source voltage VDD, is that during a period for selecting a sub-word line, the load on each local bit line is lightened and reduced to a ground potential by its corresponding memory cell. $\Delta$VBL may be used as one necessary for the amplifying operation of the pre-amplifier PA. Thus, if the time required up to the acquisition of $\Delta$VBL is short, then there is no need to reduce the lowest potential on the local bit lines to the ground potential, and the lowest potential may be set to about one-half the source voltage VDD.

Figure 5:
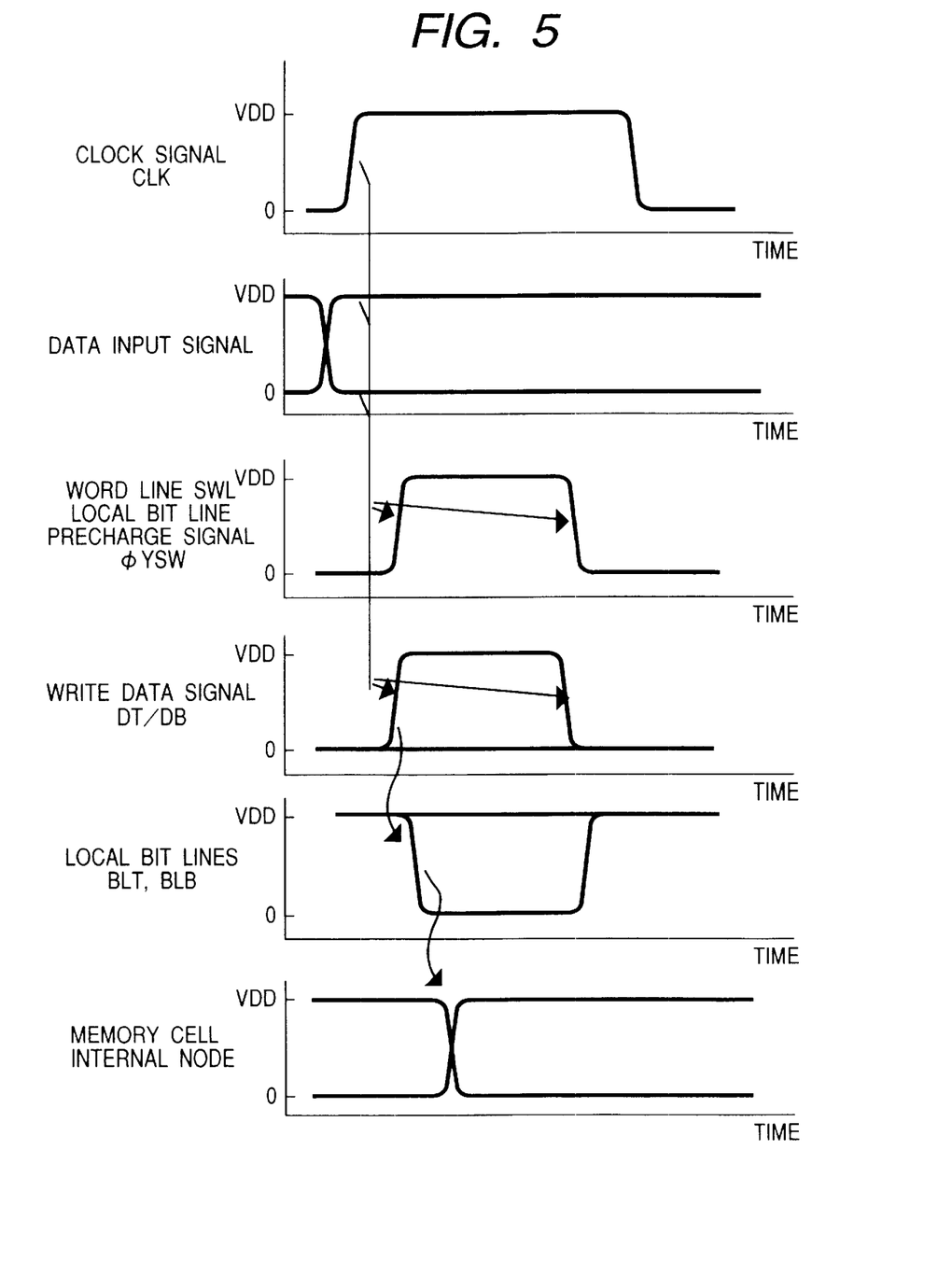
FIG. 5 is a waveform diagram for describing a write operation of a semiconductor memory circuit according to the present invention.

A waveform diagram for describing a write operation of a semiconductor memory circuit according to the present invention is shown in FIG. 5.

Address signals, a writing data input signal and a control signal are inputted in synchronism with a clock signal CLK. In response to the address signal, one word line (sub-word line) SWL in one memory block and a local bit-line precharge signal $\phi$YSW are respectively brought to a high level according to the operations of the decoder circuits and the word driver WDV. Owing to the high level of the local bit-line precharge signal $\phi$YSW, a bit line precharge circuit BPC is brought to a non-operating state and its corresponding local bit lines BLT and BLB are respectively brought to a floating state.

Write data signals DT and DB are generated in association with the data input signal. Either the bit line BLB or BLT is discharged to each memory cell connected to the local bit lines BLB and BLT based on the high level of the sub-word line SWL according to the output signal of the write amplifier WA having received the write data signals DT and DB therein. Thus, the high level/low level of the local bit lines BLB and BLT are written into their corresponding internal nodes of the memory cell.

Since each of the MOSFETs constituting each write amplifier WA is formed so as to have drive capability larger the memory cell to invert the state of storage of the memory cell, a discharge rate corresponding to the write data signal DT or DB on the local bit line BLB or BLT is made fast as compared with the read operation from the memory cell.

Figure 6:
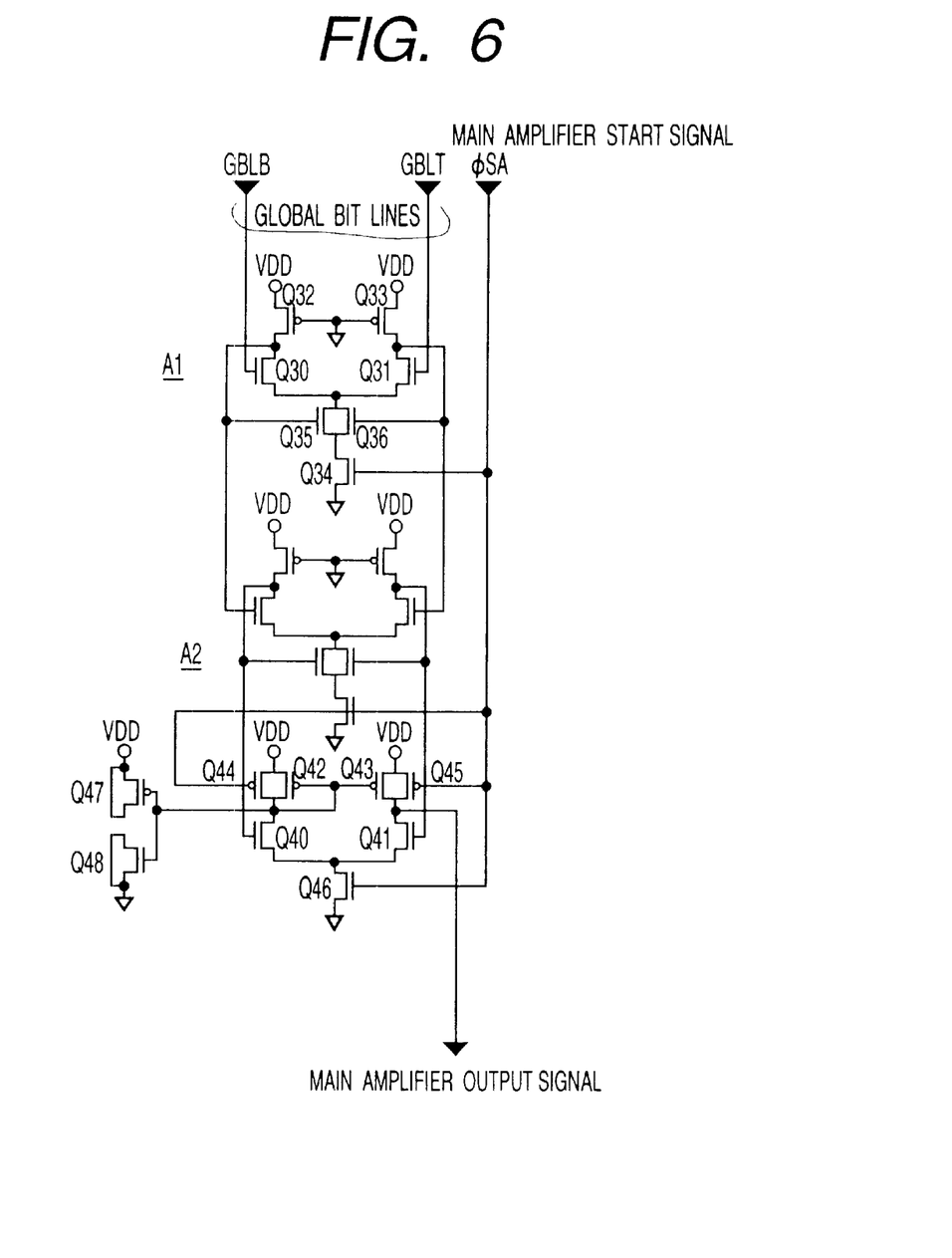
FIG. 6 is a circuit diagram showing one embodiment of a main amplifier employed in a semiconductor memory circuit according to the present invention.

A circuit diagram of one embodiment of a main amplifier employed in a semiconductor memory circuit according to the present invention is shown in FIG. 6.

A main amplifier MA comprises amplifier circuits corresponding to three stages as a whole. An initial-stage amplifier circuit Al and a next-stage amplifier circuit A2 respectively perform the amplification of a read signal while effecting a shift operation on a DC level. A final-stage amplifier circuit A3 forms a main amplifier output signal corresponding to a CMOS level.

The initial-stage amplifier circuit Al includes N channel differential MOSFETs Q30 and Q31 whose gates are respectively connected to global bit lines GBLB and GBLT, P channel MOSFETs Q32 and Q33 provided between their drains and source voltages VDD and activated as load resistors according to the supply of a circuit's ground potential to their gates on a steady basis, and an N channel MOSFET Q34 turned on in response to a main amplifier start signal φSA to thereby cause an operating current to flow in the differential MOSFETs Q23 and Q33. In the present embodiment, parallel-mode N channel MOSFETs Q35 and Q36 activated as high-resistance elements are provided between the MOSFET Q34 and the common sources of the differential MOSFETs Q30 and Q31 to set the input signal to a region in which each of input/output transfer characteristics of the differential MOSFETs Q30 and Q31 and the load MOSFETs Q32 and Q33 provided in association therewith is the highest in sensitivity. The gates of theses MOSFETs Q35 and Q36 are supplied with the output signal of the initial-stage amplifier circuit.

A current produced by the MOSFET Q34 turned on in response to the main amplifier start signal φSA flows in the parallel circuit of the MOSFETs Q35 and Q36 activated as the high-resistance elements, so that the source potentials of the differential MOSFETs Q30 and Q31 increase to the source voltage VDD. As a result, the MOSFET Q30 and load MOSFET Q32, and the MOSFET Q31 and load MOSFET Q33 are apparently activated as inverting amplifier circuits respectively. Signals inputted to such inverting amplifier circuits are signals small in amplitude, which change in the neighborhood of the source voltage VDD transferred to the above-described global bit lines GBLT and GBLB. Therefore, a reference potential applied to each of the sources of the N channel MOSFETs Q30 and Q31 constituting the inverting amplifier circuit is shifted to the source voltage VDD by the above-described high-resistance elements Q35 and Q36, whereby the initial-stage amplifier circuit Al can be operated in the region in which the sensitivity of the signal transfer characteristic is high, and an increase in ac signal component and the level shifting of a DC signal component to the low level are carried out according to its amplifying operation.

The gates of the MOSFETs Q30 and Q31 activated as the high-resistance elements are respectively supplied with the above-described amplified output signals. Therefore, their resistance values are lowered upon the commencement of amplification due to both outputs being relatively high potentials. Thus, the gate-to-source voltages of the amplifying MOSFETs Q30 and Q31 are rendered high to make an increase in sensitivity. As the amplified output signal becomes great, the gate voltage of the MOSFET Q30 or Q31 is reduced correspondingly to increase its resistance value. Thus, so to speak, feedback is applied to the amplifying operation, so that the output signal is brought to an output signal subjected to a constant level restriction.

The next-stage amplifier circuit A2 is set to the same circuit configuration as the initial-stage amplifier circuit A1. However, since the output signal of the initial-stage amplifier circuit is level-shifted to increase its amplitude, the resistance values of the MOSFETs each activated as the high resistance correspondingly are set so as to be smaller than those of the MOSFETs Q35 and Q36 of the initial-stage amplifier circuit.

The final-stage amplifier circuit A3 comprises N channel differential MOSFETs Q40 and Q41 which respectively receive complementary output signals from the amplifier circuit A2, P channel MOSFETs Q42 and Q43 provided between their drains and the source voltages VDD and brought to a current mirror mode so as to constitute an active load circuit, and an N channel MOSFET Q46 set so as to cause an operating current to flow in the differential MOSFETs Q40 and Q41 in response to the main amplifier start signal φSA. Incidentally, the load MOSFETs Q42 and Q43 are respectively provided with precharge P channel MOSFETs Q44 and Q45 in parallel form. The gates of these precharge MOSFETs Q44 and Q45 are respectively supplied with the main amplifier start signal φSA. Although not restricted in particular in the present embodiment, the gates of the load MOSFETs Q42 and Q43 are respectively provided with P channel MOSFETs Q47 and Q48 which serve as capacitances for achieving the stabilization of operation or the like while keeping the balance with their output capacitances.

Figure 7:
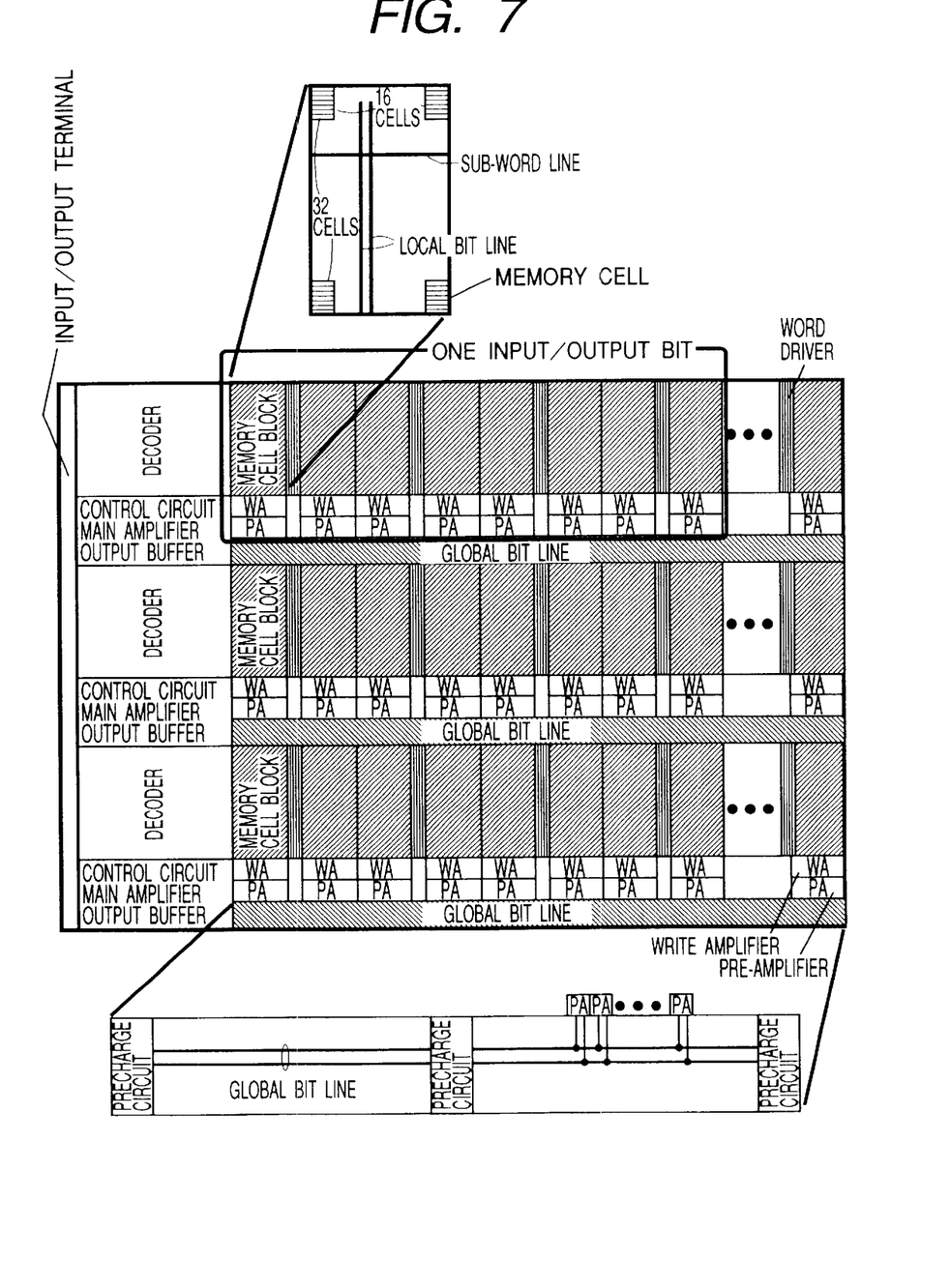
FIG. 7 is an overall layout diagram illustrating one embodiment of a semiconductor memory circuit according to the present invention.

An overall layout diagram of one embodiment of a semiconductor memory circuit according to the present invention is shown in FIG. 7.

In a memory block, sixteen memory cells are connected in a sub-word line direction and thirty-two memory cells are connected to local bit lines, as shown in the same drawing in its enlarged form. Such a memory block is provided eight in association with one input/output bit in the direction in which word lines extend. The memory blocks are divided into four sets two by two, and word drivers are provided between the adjacent memory blocks. The one input/output bit constitutes one memory cell array. When a memory access is performed in units of plural bits, a plurality of memory cell arrays each similar to the above are arranged in the direction in which the word lines extend.

A write amplifier WA is disposed on the one-end sides of the local bit lines of the memory block. A pre-amplifier PA is placed adjacent to such a write amplifier WA as viewed in the bit-line direction. Global bit lines extend in the word-line extending direction so as to be adjacent to the pre-amplifier PA. Namely, a mutual layout relationship between the memory blocks, write amplifiers WA, pre-amplifiers PA and global bit lines is established so that they are stacked on one another in order of the global bit lines, pre-amplifiers PA, write amplifiers WA and memory blocks as viewed in the bit line direction.

Decoders are provided on the one-end sides of the memory blocks as viewed in the direction in which they are arranged. Input circuits, which capture address signals, are also included in the decoders respectively. A control circuit, main amplifier and output buffer are provided on the one-end sides of the write amplifier Wa, pre-amplifier PA and global bit lines all of which corresponds to the arrangement direction of each memory block. An input circuit for a control input and a clock buffer are also included in the control circuit.

In the present embodiment, when the plurality of memory cell arrays are placed in the arrangement direction of the memory blocks as described above where the memory access is made in the units of the plural bits, the distances from the decoder circuit, control circuit and main amplifier become excessively long and hence a delay in signal developed due to it interferes with its speed-up.

Therefore, the memory cell array is placed to such an extent that the signal delay developed in the arrangement or layout direction of the memory blocks becomes insignificant so far, and configured as a basic circuit. Further, a plurality of such basic circuits are placed in the direction in which the bit lines extend. The present embodiment shows an example in which three basic circuits are placed. Thus, an increase or decrease in the basic circuit in association with a bit width of data makes it possible to configure a semiconductor memory circuit (RAM macro) having an arbitrary bit width.

Further, the semiconductor memory circuit is provided with input/output terminals in association with the decoders, control circuits and output buffers. Therefore, the semiconductor memory circuit according to the present embodiment has the feature that the input/output terminals are provided along one side of a squared memory circuit area.

Figure 8:
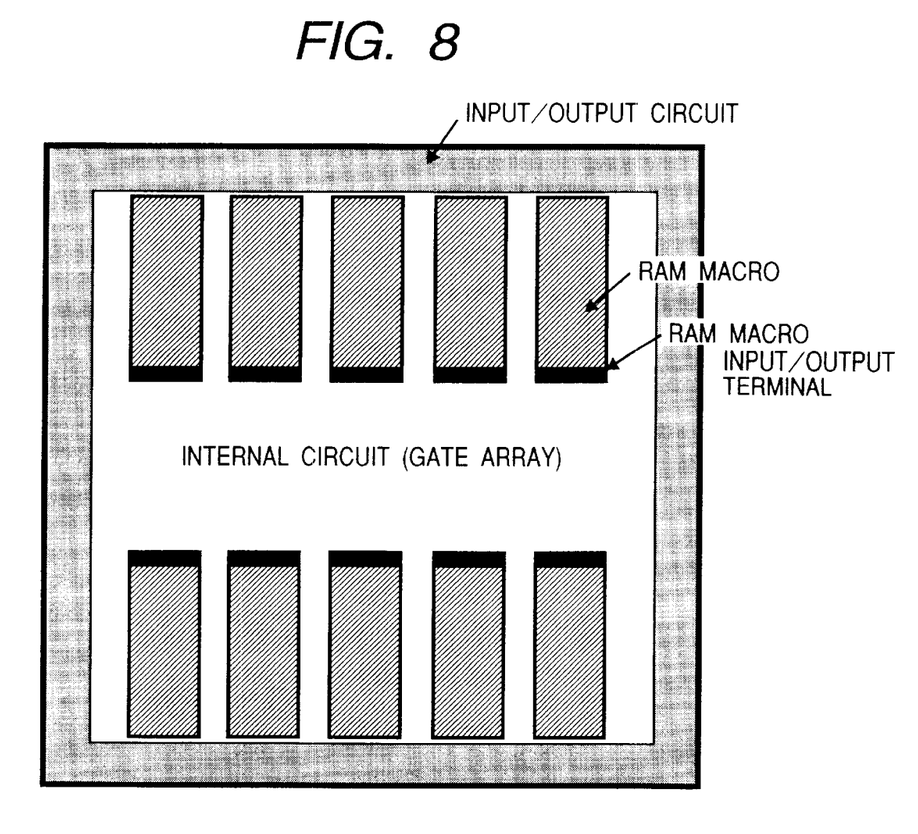
FIG. 8 is a layout diagram depicting one embodiment of a semiconductor integrated circuit device equipped with semiconductor memory circuits according to the present invention.

A layout diagram of one embodiment of a semiconductor integrated circuit device equipped with semiconductor memory circuits according to the present invention is shown in FIG. 8.

The present embodiment comprises an internal logic gate circuit comprised of a CMOS gate array, and RAM macros whose memory operations are controlled by its logic circuit. As in the above embodiment in this case, the semiconductor memory circuits (RAM macros) are placed with input/output terminals concentrated on their one-end sides. Thus, a plurality of the RAM macros are laid out so that areas with the input/output terminals provided therein are directed to a central portion of a semiconductor substrate. In the present embodiment, an input/output circuit for electrically connecting to other electronic equipment is provided around a semiconductor chip. An internal area of the semiconductor chip, which excludes it, is divided into three equal parts in the vertical direction of the same drawing as a whole. The input/output terminals of the RAM macros are placed on both sides so as to be directed inside. The internal circuit comprising the gate array is provided in an area interposed between the RAM macros.

Incidentally, a space in which a gate array for effecting signal transfer and logical processing on an input/output circuit used as a semiconductor integrated circuit device and the internal circuit is formed, is ensured between the adjacent RAM macros.

Figure 9:
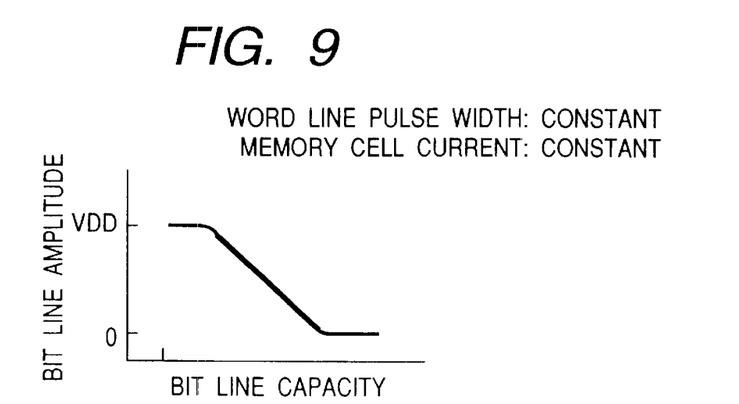
FIG. 9 is a characteristic diagram showing the relationship between bit line amplitude and bit line capacitance for describing the present invention.

A bit-line amplitude vs. bit-line capacitance characteristic diagram for describing the present invention is shown in FIG. 9. A relationship is established wherein when a memory cell current and a pulse width for each word line are kept constant, the bit-line amplitude decreases as the bit-line capacitance increases. In the prior art, a large number of memory cells are connected so that the bit-line amplitude becomes small through the use of its relationship, and the amplitude of a signal on each bit line is reduced, whereby a high-speed read operation is carried out. A reduction in bit-line amplitude becomes advantageous when the memory cell is selected in turn according to the switching between the word lines to thereby perform a read operation. A signal delay developed due to the reduction in the amplitude of the signal on each bit line is solved by increasing the sensitivity of each sense amplifier.

However, since there is a limit even on the sensitivity of the sense amplifier due to the scale-down of a device or element with the progress in the semiconductor technology, the above-described idea cannot satisfy both the scale-down and speed-up of the device.

It has been noted that in the invention of the present application, the conventional idea is changed and larger amplitude may be formed in each memory cell per se if there is the limit on the sensitivity of the sense amplifier. Since the memory cell itself is reduced in absolute drive capability due to the scale-down of the device, the load on bit lines connected to the memory cell is lightened to thereby equivalently increase the drive capability of the memory cell as is understood from the characteristic diagram shown in FIG. 9.

Owing to the increase in read amplitude from such a memory cell, the timing provided to start the operation of each pre-amplifier can be made fast or advanced substantially in accordance with the timing provided to select each word line. Therefore, high-speed reading is made possible even when the memory cell is scaled down.

The present embodiment indicates the fear that since the amplitude of the signal on the bit lines is made great upon the read operation, the conventional idea would delay the next reading. However, since the signal amplitude becomes great due to the reduction in the load on each bit line, a precharge operation for the next reading can also be carried out at high speed, and the writing under low power consumption is allowed even upon the write operation while MOSFETs small in size are being used.

In the memory block, the number of the memory cells connected to the local bit lines may be increased to 64. Namely, in the conventional static RAM, a large number of memory cells are connected for mass storage capacity as in the case of 256 or 512. As compared with such a number, the number or numeric value equivalent to 64 is equal to one-fourth to one-eighth the number. Namely, it means that the parasitic capacitance of each bit line is also reduced to ¼ or ⅛. Consequently, since the load on each memory cell is greatly lightened as described above, a change in signal amplitude per time is made fast correspondingly, so that the timing provided to start the operation of each pre-amplifier can be advanced.

Operations and advantageous effects obtained from the above-described embodiments are as follows:

(1) An effect is obtained in that in a memory cell array configured using static memory cells, pre-amplifiers each of which receives a signal of a memory cell read into each of complementary bit line pairs, and a main amplifier which receives a signal outputted from the pre-amplifier, are provided, and the number of a plurality of the memory cells connected to the complementary bit lines is restricted in such a manner that the amplitude of the signal read into the complementary bit line pair, which is supplied to the input of the pre-amplifier, becomes greater than that of a signal outputted from the pre-amplifier during a period of from the selection of a word line to the start of the operation of the main amplifier, whereby high-speed reading is made possible while each scaled-down memory cell is being used.

(2) An effect is obtained in that the amplitude of the signal read into the complementary bit line pair is set to full amplitude corresponding to a source voltage, and the amplitude of the signal outputted from the pre-amplifier is set to small amplitude corresponding to a signal amount necessary for the amplifying operation of the main amplifier, whereby the transfer of the output signal of the pre-amplifier can be carried out at high speed while the timing provided to start the operation of each pre-amplifier is being put forward, thus making it possible to implement a high-speed read operation.

(3) An effect is obtained in that the amplitude of the signal read into the complementary bit line pair is set so as to be substantially identical to signal amplitude at a write operation, and the amplitude of the signal outputted from the pre-amplifier is set to small amplitude corresponding to a signal amount necessary for the amplifying operation of the main amplifier, whereby the transfer of the output signal of the pre-amplifier can be carried out at high speed while the timing provided to start the operation of each pre-amplifier is being put forward, thus making it possible to implement a high-speed read operation.

(4) An effect is obtained in that the amplitude of the signal read into the complementary bit line pair is set to half or more of signal amplitude at a write operation, and the amplitude of the signal outputted from the pre-amplifier is set to small amplitude corresponding to a signal amount necessary for the amplifying operation of the main amplifier, whereby the transfer of the output signal of the pre-amplifier can be speeded up while the timing provided to start the operation of each pre-amplifier is being put forward, thus making it possible to implement a high-speed read operation.

(5) An effect is obtained in that the number of the memory cells connected to the complementary bit line pairs is limited to 64 or below, whereby the transfer of the output signal of the pre-amplifier can be speeded up while the timing provided to start the operation of each pre-amplifier is being put forward, thus making it possible to implement a high-speed read operation.

(6) An effect is obtained in that each of the static memory cells comprises a CMOS latch circuit wherein inputs and outputs of two CMOS inverter circuits respectively comprising P channel MOSFETs and N channel MOSFETs are cross-connected to one another, and N channel transfer gates MOSFETs provided between a pair of input/output nodes of the CMOS latch circuit and the complementary bit line pair and whose gates are connected to the corresponding word line, thereby making it possible to perform a stable storage operation under low power consumption while a high-speed read operation is being realized.

(7) An effect is obtained in that the pre-amplifier comprises differential MOSFETs whose inputs are connected to the complementary bit line pair, load means provided at the drains of the differential MOSFETs, a switch MOSFET brought to an operating state by a column select signal to thereby cause an operating current to flow in the differential MOSFETs, and output selection MOSFETs switch-controlled by the column select signal to connect differential amplifying output terminals to their corresponding global bit lines, thereby making it possible to reduce an operation start timing margin and make the connection of the outputs of the pre-amplifiers by wired OR logic, whereby a high-speed operation and circuit's simplification can be achieved.

(8) An effect is obtained in that the differential MOSFETs make use of N channel MOSFETs and the load MOSFETs make use of P channel MOSFETs whose gates and drains are cross-connected and whose sources are supplied with the source voltage, thereby making it possible to cause even the load MOSFETs to have amplifying action and allow precharge MOSFETs to provide simple reset, whereby a speed-up is made possible.

(9) An effect is obtained in that output terminals of each write amplifier for transferring a write signal having full amplitude like the source voltage and a circuit's ground potential to the complementary bit line pair are connected to the complementary bit line pair, whereby a write operation can also be speeded up.

(10) An effect is obtained in that the write amplifier is brought to an operating state by the column select signal and makes use of a pair of MOSFETs for discharging one bit line in association with write data, whereby high-speed writing is allowed with a simple configuration.

(11) An effect is obtained in that as the main amplifier, an input amplifier circuit wherein initial-stage and next-stage amplifier circuits for level-shifting the small amplitude signal in the neighborhood of the source voltage to the circuit's ground potential side are connected in tandem, and an output amplifier circuit for forming an amplified signal having full amplitude corresponding to the source voltage in response to the amplified signal of the input amplifier circuit, are used, whereby a high-speed operation is allowed.

(12) An effect is obtained in that a plurality of pre-amplifiers are connected to their corresponding global bit lines through the output selection MOSFETs switch-controlled by the column select signal, and the input terminals of the main amplifier are connected to the global bit line pair, whereby a read-system circuit can be formed by a simple configuration based on wired OR logic.

(13) An effect is obtained in that a plurality of precharge circuits for supplying the source voltage are laid out distributively over the global bit lines, thereby making it possible to rest the global bit lines at high speed and perform continuous read operations from the plurality of memory cells at high speed.

(14) An effect is obtained in that the word lines extend in a first direction, the complementary bit line pairs extend in a second direction orthogonal to the first direction, the pre-amplifier and write amplifier are placed at one end of each complementary bit line pair to constitute one memory block, a plurality of the memory blocks are placed side by side in the first direction to constitute the memory cell array, a decoder for forming a signal for selecting each of the word and bit lines is placed on the one-end side of the memory cell array as viewed in the first direction, the global bit lines extend along the arrangement direction corresponding to the first direction, of the pre-amplifiers and write amplifiers corresponding to the plurality of memory blocks, a control circuit, the main amplifier and an output buffer are provided on the one-end sides corresponding to the decoder, of the global bit lines, and input/output terminals corresponding to address signals, a control signal and write and read data are laid out along the one-end sides corresponding to the decoder, the control circuit and the output buffer, whereby the above configuration is excellent in usability as each of RAM macros installed in a semiconductor integrated circuit device, and memory control circuits can concentratedly be formed so as to be adjacent to the input/output terminals, thus allowing a high-speed operation.

(15) An effect is obtained in that the memory block referred to above is provided with a word driver for receiving a signal for the main word line extending along the plurality of memory blocks and a block select signal, and the static memory cell is connected to a sub-word line selected by the word driver, whereby the word lines can also be formed as a hierarchical structure, and current consumption of high-speed selected and non-selected memory cells can be reduced.

(16) An effect is obtained in that the one-end side provided with the input/output terminals, of the semiconductor memory circuit is arranged toward the center of a semiconductor chip in plural form, whereby memory control circuits can centralizedly be formed so as to be adjacent to the input/output terminals, thus allowing a high-speed operation.

While the invention made above by the present inventors has been described specifically based on the embodiments, the invention of the present application is not limited to the above embodiments. It is needless to say that various changes can be made thereto within the scope not departing from the substance thereof. For example, the memory cell may be one obtained by replacing the P channel MOSFETs with high-resistance means in addition to a fully static memory cell in which an input and an output of a CMOS inverter circuit are cross-connected. The number of memory cells connected to bit lines may increase like 128 with an increase in drive current of each memory cell, for example, in addition to the numbers such as 64 or 32 referred to above. Specific configurations of respective circuits for a write amplifier, a pre-amplifier and a main amplifier can take various embodiments. The layout of the semiconductor memory circuit is not limited to FIG. 7 and can take various embodiments.

INDUSTRIAL APPLICABILITY

This invention can widely be used in various semiconductor integrated circuit devices including semiconductor memory circuits using static memory cells.

What is claimed is:

1. A semiconductor integrated circuit device having a semiconductor memory circuit incorporated therein, comprising:

memory cell arrays each provided with a plurality of static memory cells at points where a plurality of word lines and a plurality of complementary bit line pairs intersect;

precharge circuits which respectively precharge said complementary bit line pairs by a source voltage;

pre-amplifiers each of which receives a signal of a memory cell, which is read into each of said complementary bit line pairs; and main amplifiers each of which receives a signal outputted from said each pre-amplifier, wherein the number of the plurality of memory cells connected to the complementary bit lines is restricted in such a manner that the amplitude of the signal read into said each complementary bit line pair, which is supplied to the input of said each pre-amplifier, becomes greater than that of a signal outputted from said pre-amplifier during a period of from the selection of said each word line to the start of the operation of said each main amplifier.

2. The semiconductor integrated circuit device according to claim 1, wherein the amplitude of the signal read into said complementary bit line pair is full amplitude corresponding to the source voltage, and wherein the amplitude of the signal outputted from said pre-amplifier is small amplitude corresponding to a signal amount necessary for the amplifying operation of said main amplifier.

3. The semiconductor integrated circuit device according to claim 1, wherein the amplitude of the signal read into said complementary bit line pair is set so as to be substantially identical to signal amplitude at a write operation, and wherein the amplitude of the signal outputted from said pre-amplifier is small amplitude corresponding to a signal amount necessary for the amplifying operation of said main amplifier.

4. The semiconductor integrated circuit device according to claim 1, wherein the amplitude of the signal read into said complementary bit line pair is half or more of signal amplitude at a write operation, and wherein the amplitude of the signal outputted from said pre-amplifier is small amplitude corresponding to a signal amount necessary for the amplifying operation of said main amplifier.

5. The semiconductor integrated circuit device according to claim 1, wherein the number of said memory cells connected to the complementary bit line pairs is 64 or below.

6. The semiconductor integrated circuit device according to claim 1, wherein each of said static memory cells comprises a CMOS latch circuit wherein inputs and outputs of two CMOS inverter circuits respectively comprising P channel MOSFETs and N channel MOSFETs are cross-connected to one another, and N channel transfer gates MOSFETs provided between a pair of input/output nodes of said CMOS latch circuit and the complementary bit line pair and whose gates are connected to the corresponding word line.

7. The semiconductor integrated circuit device according to claim 1, wherein said pre-amplifier comprises differential MOSFETs whose inputs are connected to the complementary bit line pair, load means provided at the drains of the differential MOSFETs, a switch MOSFET brought to an operating state by a column select signal to thereby cause an operating current to flow in said differential MOSFETs, and output selection MOSFETs switch-controlled by the column select signal to connect differential amplifying output terminals to their corresponding global bit lines.

8. The semiconductor integrated circuit device according to claim 7, wherein said differential MOSFETs comprise N channel MOSFETs, wherein said load MOSFETs comprise P channel MOSFETs whose gates and drains are cross-connected and whose sources are supplied with the source voltage, and wherein said load MOSFETs are respectively parallel-provided with P channel precharge MOSFETs whose gates are supplied with the column select signal.

9. The semiconductor integrated circuit device according to claim 7, wherein output terminals of each write amplifier for transferring a write signal having full amplitude, like the source voltage and a circuit's ground potential to the complementary bit line pair are connected to the complementary bit line pair.

10. The semiconductor integrated circuit device according to claim 9, wherein said write amplifier is brought to an operating state by the column select signal and includes a pair of MOSFETs for discharging one bit line in association with write data.

11. The semiconductor integrated circuit device according to claim 7, wherein a plurality of pre-amplifiers are connected to the global bit lines through the output selection MOSFETs switch-controlled by the column select signal, and said each global bit line pair is connected to the input terminals of the main amplifier.

12. The semiconductor integrated circuit device according to claim 11, wherein said main amplifier comprises an input amplifier circuit wherein initial-stage and next-stage amplifier circuits for level-shifting the small amplitude signal in the neighborhood of the source voltage to the circuit ground potential side are connected in tandem, and an output amplifier circuit for forming an amplified signal having full amplitude corresponding to the source voltage in response to the amplified signal of said input amplifier circuit.

13. The semiconductor integrated circuit device according to claim 12, wherein a plurality of precharge circuits for supplying the source voltage are laid out distributively over the global bit lines.

14. The semiconductor integrated circuit device according to claim 11, wherein said word lines extend in a first direction, said complementary bit line pairs extend in a second direction orthogonal to the first direction, said pre-amplifier and write amplifier are placed at one end of said each complementary bit line pair to constitute one memory block, wherein said memory cell array comprises a plurality of said memory blocks placed side by side in the first direction, wherein a decoder for forming a signal for selecting each of the word and bit lines is placed on the one-end side of said memory cell array as viewed in the first direction, wherein said global bit lines extend along the arrangement direction corresponding to the first direction, of said pre-amplifiers and write amplifiers corresponding to said plurality of memory blocks, wherein a control circuit, said main amplifier and an output buffer are provided on the one-end sides corresponding to said decoder, of said global bit lines, and wherein input/output terminals corresponding to address signals, a control signal and write and read data with respect to said semiconductor memory circuit are laid out along the one-end sides corresponding to the decoder, the control circuit and the output buffer.

15. The semiconductor integrated circuit device according to claim 14, wherein said each memory block is provided with a word driver for receiving a signal for the main word line extending along said plurality of memory blocks and a block select signal, and wherein said each static memory cell is connected to a sub-word line selected by said word driver.

16. The semiconductor integrated circuit device according to claim 14, wherein a plurality of the one-end sides respectively provided with the input/output terminals, of said semiconductor memory circuits are arranged toward the center of a semiconductor chip.

17. The semiconductor integrated circuit device according to claim 1, wherein said main amplifier comprises an input amplifier circuit wherein initial-stage and next-stage amplifier circuits for level-shifting the small amplitude signal in the neighborhood of the source voltage to the circuit ground potential side are connected in tandem, and an output amplifier circuit for forming an amplified signal having full amplitude corresponding to the source voltage in response to the amplified signal of said input amplifier circuit.

* * * * *